US005695912A

United States Patent [19]

Hyakutake et al.

[11] Patent Number: 5,695,912

[45] Date of Patent: Dec. 9, 1997

[54] DESENSITIZING SOLUTION FOR OFFSET PRINTING

[75] Inventors: Hayato Hyakutake, Hino; Hirotsuga Saito, Fujimi; Ryo Kobirumaki, Hachioji, all of Japan

[73] Assignee: Iwatsu Electric Co., Ltd., Tokyo, Japan

[21] Appl. No.: 675,103

[22] Filed: Jul. 3, 1996

Related U.S. Application Data

[63] Continuation of Ser. No. 473,767, Jun. 6, 1995, abandoned, which is a continuation-in-part of Ser. No. 771,424, Oct. 4, 1991, abandoned.

[30] Foreign Application Priority Data

| | | | |
|---|---|---|---|
| Oct. 8, 1990 | [JP] | Japan | 2-268440 |
| Feb. 26, 1991 | [JP] | Japan | 3-030896 |

[51] Int. Cl.$^6$ .......... G03F 7/30

[52] U.S. Cl. .......... 430/309; 430/300; 430/302; 430/327; 430/331

[58] Field of Search .......... 430/300, 302, 430/309, 327, 331

[56] References Cited

U.S. PATENT DOCUMENTS

| | | | |
|---|---|---|---|
| 3,544,476 | 12/1970 | Alba et al. | 252/175 |
| 3,697,304 | 10/1972 | Uchida et al. | 430/49 |
| 3,908,547 | 9/1975 | Rochlitz | 430/104 |
| 3,915,904 | 10/1975 | Tonkyn et al. | 210/736 |
| 4,369,173 | 1/1983 | Causland et al. | 424/35 |
| 4,401,574 | 8/1983 | Farrington et al. | 210/728 |
| 4,655,934 | 4/1987 | Rose et al. | 252/175 |

FOREIGN PATENT DOCUMENTS

| | | |
|---|---|---|
| 3908416 | 5/1964 | Japan . |
| 5805799 | 2/1983 | Japan . |
| 62-77994 | 4/1987 | Japan . |
| 2268440 | 10/1990 | Japan . |
| 3030896 | 2/1991 | Japan . |
| 1006624 | 10/1965 | United Kingdom . |

OTHER PUBLICATIONS

Webster's New World Dictionary, 3rd College Edition, V. Neufeldt ed. Simon & Schuster, Inc. NY (1988) English Abstract p. 4., 561,769.

English Abstract (JOAB) file on APS) of Japanese Patent 59–179200; Oct. 11, 1984 pub.

English Abstract (JOAB file on APS) of Japanese Patent 58–112096; Jul. 4, 1983 pub.

English Abstract (JOAB file on APS) of Japanese Patent 58–51998; Mar. 26, 1983 pub.

*Primary Examiner*—Hoa Van Le
*Attorney, Agent, or Firm*—Paul & Paul

[57] ABSTRACT

A desensitizing solution for offset printing is provided, which is characterized by containing an inorganic ionic polymer of basic aluminum chloride or a derivative thereof, represented by the general formula $[Al_2(OH)_nCl_{6-n}]_m$ where $0<n<6$ and $m>1$. The amount of basic aluminum chloride or a derivative is 5 to 50% by weight and the pH of the solution is 2 to 5. This solution can be free from a ferrocyanic or ferricyanic compound but provide a hydrophilic coating layer with a strong physical strength on a non-image area.

7 Claims, No Drawings

DESENSITIZING SOLUTION FOR OFFSET PRINTING

CROSS REFERENCE TO RELATED APPLICATION

This is a continuation of application Ser. No. 08/473,767 filed on Jun. 6, 1995 now abandoned, which is a continuation in part of Ser. No. 07/771,424 file on Oct. 4, 1991 now abandoned.

BACKGROUND OF THE INVENTION

1. Field of the Invention

The present invention relates to a desensitizing solution. More particularly, the present invention is concerned with a desensitizing solution for offset printing for use in the desensitization (hereinafter referred to as "etching") of an original plate for offset printing. The desensitizing solution of the present invention can be advantageously used particularly for the preparation of an electrophotographic plate for an offset plate (hereinafter referred to as "master") having a photosensitive layer comprising a photoconductive powder, for example, zinc oxide, and a resin binder.

2. Description of the Related Art

A printing method known in the above-described offset printing comprises subjecting the surface of a photosensitive layer of a master to a series of treatments, i.e., charging, exposure, development and fixation to form a lipophilic image, desensitizing the non-image portion of the photosensitive layer with a desensitizing solution, depositing an ink on the lipophilic image and finally transferring the image onto paper. In this case, as is well known in the art, the desensitizing solution is used for the purpose of coating it on the surface of a master to form a hydrophilic coating on the non-image portion, thereby preventing the deposition of an oil ink on the non-image portion.

Various desensitizing solutions have hitherto been proposed and used. For example, Japanese Examined Patent Publication (Kokoku) No. 39-8416 discloses a desensitizing solution composed mainly of a ferrocyanic compound or a ferricyanic compound. This type of desensitizing solution has the advantages of having a high desensitizing force and providing a high mechanical strength hydrophilic layer but has the disadvantages of lowering the desensitizing force with the lapse of time because the ferrocyanic compound or ferricyanic compound is unstable to light or heat. Further, this desensitizing solution has the significant drawback of containing a cyanide ion. The ferrocyanic compound and ferricyanic compound themselves are considered to be stable and harmless to a human body but since they contain cyanide ion, disposal of these compounds may cause environmental problems by releasing free cyanide ions.

There is also proposed a desensitizing solution which can avoid generation of free cyanide (hereinafter referred to as "cyanide-free"). For example, Japanese Examined Patent Publication (Kokoku) No. 58-5799 and Japanese Unexamined Patent Publication (Kokai) No. 62-77994 disclose a desensitizing solution comprising myoinositol hexaphosphate (hereinafter referred to as "phytic acid") as a main ingredient. However, the hydrophilic coating layer formed by the desensitizing solution shows a weak effectiveness, so that background soil appears in the non-image area. Particularly, in a desensitizing treatment in an etching processer conventionally used in this field, the sensitizing force is further lowered.

The object of the present invention is to provide a desensitizing treatment free from the above described problems and drawbacks.

Specifically, the object of the present invention is to provide an excellent desensitizing solution for offset printing, which is free from a ferrocyanic compound or ferricyanic compound deteriorating under light or heat to cause environmental problems, consisting only of harmless ingredients, and which can form a hydrophilic coating layer with a strong physical strength on a non-image area under any desensitizing conditions.

SUMMARY OF THE INVENTION

In the present invention, the above-described object is attained by providing a desensitizing solution for offset printing characterized by containing an inorganic ionic polymer of basic aluminum chloride or a derivative thereof. The desensitizing solution of the present invention may be used in combination with a desensitizing solution for offset printing comprising phytic acid or a derivative thereof.

The desensitizing solution in offset printing should react with metal ions on the surface of non-image areas of a plate to form a water insoluble hydrophilic compound.

In the case of a master, as is known, it is etched by an acid desensitizing solution to ionize zinc oxide present on the surface thereof. This ionized $Zn^{2+}$ reacts with a hydrophilic agent such as phytic acid to form a water-insoluble hydrophilic compound, so that they can act as a desensitizing solution for offset printing.

An acid solution containing basic aluminum chloride or a derivative thereof, when used in combination with a desensitizing solution comprising phytic acid, amplifies the efficiency of the above-described reaction between zinc ions and phytic acid, so that it can provide a hydrophilic coating layer having a higher effectiveness than that obtainable by sole use of a conventional desensitizing solution containing phytic acid.

The basic aluminum chloride used in the present invention is an inorganic ionic polymer, and is represented by the general formula $[Al_2(OH)_nCl_{6-n}]_m$ where $0<n<6$ and $m>1$, the basicity depending on the values of n and m also known as poly(aluminum chloride) (PAC), aluminum hydroxychloride, aluminum chlorohydroxide or hydroxy aluminum chloride. The basic aluminum chloride changes its chemical structure in an aqueous solution depending on the pH of the solution. The desensitizing solution of the present invention is an acid with a pH of 2 to 5, wherein the basic aluminum chloride takes the form of a polymer having a constitutional unit of $[Al(OH)(H_2O)_5]^{2+}$ and/or $[Al(OH)(H_2O)_6]^{3+}$, which is considered to react with the surface of a zinc oxide master. In a solution of basic aluminum chloride with a pH of more than 5, the basic aluminum chloride changes its chemical structure to form a precipitate, $Al(OH)_3$, and formation of zinc ions from the surface of a zinc oxide master is suppressed, so that the function of the desensitizing solution is lowered. In a solution of the basic aluminum chloride with a pH of less than 2, the reaction between zinc ions and basic aluminum chloride encounters interference so that a desensitizing coating layer cannot be sufficiently obtained.

In the desensitizing solution of the present invention, the basic aluminum chloride and derivatives thereof can be used alone or in combination. The amount of the basic aluminum chloride or a derivative thereof (the total amount of the two combined) is generally 5 to 50% by weight, preferably 10 to 30% by weight of the solution. If the amount is too small, the effectiveness of the hydrophilic coating layer is lowered and if the amount is excessive, the viscosity of the solution increases and desensitization and ink attachment in fine texture areas become insufficient.

As described above, the inventors found that an acid desensitizing solution containing basic aluminum chloride or a derivative thereof in an amount of 5 to 50% by weight and having a pH of 2 to 5 exhibits a remarkable effect in desensitizing a master.

The desensitizing solution of the present invention may be used as a mixture of a plurality of basic aluminum chloride and derivatives thereof, if necessary. Moreover, it may further contain arbitrary additives including pH adjusters, pH buffers, wetting agents, penetrating agents, antiseptic agents, rust preventatives, and others. The pH adjusters may be organic and inorganic acids. The wetting agents may be alcohols, ethyleneglycols, sorbitol, glycerin, gum arabic, etc. The penetrating agents may be surfactants. The antiseptic agents may be salicylic acid and sodium dehydroacetate. The rust preventatives may be EDTA (ethylenediamine tetraacetic acid) and amines. Other additives may be water soluble polymers.

The desensitizing solution of the present invention may be used in any treating apparatus of etching processers conventionally used in the field. Moreover, this solution may be used as one for hand etching, which is also effective.

The desensitizing solution of the present invention may be used in combination with other desensitizing solutions containing a hydrophilizing agent of various compounds.

If the desensitizing solution used in combination is a cyanide-free one, phytic acid or a derivative thereof is preferably used. Of course, a hydrophilizing agent other than phytic acid and derivatives thereof may be used. The phytic acid or a derivative thereof may be used in combination with other hydrophilizing agent. If it is acceptable, a ferrocyanic compound or ferricyanic compound may be used as a hydrophilizing agent in a desensitizing agent which is used in combination with the desensitizing solution of the present invention.

EXAMPLES

Production Examples 1 to 3 are for the production of desensitizing solutions of the present invention; Production Examples 4 to 7 are for the production of desensitizing solutions similar to those of the present invention but having the pH and the content of basic aluminum chloride outside the ranges of the present invention; and Production Examples 8 to 9 are production of desensitizing solutions of the prior art.

Production Example 1

A desensitizing solution was prepared according to the following recipe.

| | |
|---|---|
| Water | 670 parts |
| Poly(aluminum chloride) (Takibine#1500 produced by Taki Chemical Co., Ltd.) | 300 parts |
| Succinic acid | 10 parts |
| Ethylene glycol monoethyl ether | 10 parts |
| Inositol | 10 parts |
| Total | 1000 parts |

pH: 4.03
Content of basic aluminum chloride: 15 wt %

Production Example 2

A desensitizing solution was prepared according to the following recipe.

| | |
|---|---|
| Water | 670 parts |
| 50%-Poly(aluminum chloride) solution (Banoltan White produced by Taki Chemical Co., Ltd.) | 350 parts |
| Malonic acid | 20 parts |
| Total | 1000 parts |

pH: 3.51
Content of basic aluminum chloride: 17.5 wt %

Production Example 3

A desensitizing solution was prepared according to the following recipe.

| | |
|---|---|
| Water | 620 parts |
| 50%-Poly(aluminum sulfate) solution (PAC300M produced by Taki Chemical Co., Ltd.) | 150 parts |
| 50%-Poly(aluminum chloride) solution (Banoltan White produced by Taki Chemical Co., Ltd.) | 200 parts |
| Potassium aluminum sulfate | 30 parts |
| Total | 1000 parts |

pH: 3.65
Content of basic aluminum chloride: 17.5 wt %

Production Example 4

A desensitizing solution was prepared according to the following recipe.

| | |
|---|---|
| Water | 640 parts |
| 50%-Poly(aluminum chloride) solution (Banoltan White produced by Taki Chemical Co., Ltd.) | 350 parts |
| Sodium Carbonate | 10 parts |
| Total | 1000 parts |

pH: 5.82
Content of basic aluminum chloride: 17.5 wt %

Production Example 5

A desensitizing solution was prepared according to the following recipe.

| Recipe | |
|---|---|
| Water | 670 parts |
| 50%-Poly(aluminum chloride) solution (Takiban#1500 produced by Taki Chemical Co., Ltd.) | 300 parts |
| Succinic acid | 10 parts |
| Ethylenglycolmonoethylether | 10 parts |
| Inocytol | 10 parts |
| Total | 1000 parts |

pH: adjusted to 1.5 by nitric acid
Content of basic aluminum chloride: 15 wt %

Production Example 6

A desensitizing solution was prepared according to the following recipe.

| | |
|---|---|
| Water | 380 parts |
| Poly(aluminum chloride) (Takibain 3000 produced by Taki Chemical Co., Ltd.) | 600 parts |
| Malonic acid | 20 parts |
| Total | 1000 parts |

pH: 3.65
Content of basic aluminum chloride: 60 wt %

Production Example 7

A desensitizing solution was prepared according to the following recipe.

| | |
|---|---|
| Water | 880 parts |
| 50%-Poly(aluminum chloride) solution (Banoltan White produced by Taki Chemical Co., Ltd.) | 100 parts |
| Malonic acid | 20 parts |
| Total | 1000 parts |

pH: 3.88
Content of basic aluminum chloride: 5 wt %

Production Example 8

A desensitizing solution was prepared according to the following recipe.

| | |
|---|---|
| Water | 910 parts |
| Phytic acid | 30 parts |
| Malonic acid | 20 parts |
| Adipic acid | 20 parts |
| Ethyleneglycol | 16 parts |
| EDTA-disodium | 4 parts |
| Total | 1000 parts |

pH: adjusted to 4.50 by sodium hydroxide
EDTA: Ethylenediaminetetraacetic acid

Production Example 9

A desensitizing solution was prepared according to the following recipe.

| | |
|---|---|
| Water | 889 parts |
| Potassium ferrocyanate | 20 parts |
| Monoammonium phosphate | 60 parts |
| Diammonium citrate | 30 parts |
| EDTA-disodium | 1 part |
| Total | 1000 parts |

pH: adjusted to 4.50 by potassium hydroxide

EXAMPLES

Tests for printing with the desensitizing solutions prepared in the above were conducted by the following manner.

A plate was prepared by using an electrostatic plate maker (AP-10Ex manufactured by Iwatsu Electric Co., Ltd.), master papers (EL-3 produced by Iwatsu Electric Co., Ltd.) and a developer (AP-10 set produced by Ewatsu Electric Co., Ltd). The thus prepared plates were treated with the desensitizing solutions prepared in the above Production Examples, and printing was conducted by an offset printing machine (AB Dick 350 manufactured by AB Dick Inc.). The printing ink used was F gloss black #85 (produced by Dainippon Ink & Chemicals, Inc.) and the fountain solution used was Fountain Solution U (10 fold diluted, produced by Iwatsu Electric Co., Ltd.).

The desensitizing treatment was conducted using an etching processer manufactured by Ricoh in the following procedures: Plate making→1st desensitizing treatment (ES-1)→Dry→2nd desensitizing treatment (ES-2)→Printing.

The treatment conditions and the results are shown in Table 1. The results indicate the number of printed papers on which background fog appeared and ink receptability.

TABLE 1

Examples and Printing Results

| | Treatment conditions | | Printing results | |
|---|---|---|---|---|
| Example | ES-1 | ES-2 | Printing number when background fog appeared | Ink receptability |
| Example 1 | Production Example 1 | Production Example 8 | more than 5,000 | o |
| Example 2 | Production Example 2 | Production Example 8 | more than 5,000 | o |
| Example 3 | Production Example 3 | Production Example 8 | more than 5,000 | o |
| Example 4 | Production Example 1 | Production Example 9 | more than 5,000 | o |
| Example 5 | Production Example 2 | Production Example 9 | more than 5,000 | o |
| Example 6 | Production Example 3 | Production Example 9 | more than 5,000 | o |
| Comparative Example 1 | Production Example 4 | Production Example 8 | from 200 | x |
| Comparative Example 2 | Production Example 5 | Production Example 8 | from 250 | o |
| Comparative Example 3 | Production Example 6 | Production Example 8 | more than 5,000 | x |
| Comparative Example 4 | Production Example 7 | Production Example 8 | from 300 | o |
| Comparative Example 5 | Production Example 8 | Production Example 9 | from 1,500 | Δ |
| Comparative Example 6 | Production Example 8 | Production Example 8 | from 100 | Δ |
| Comparative Example 7 | Production Example 9 | Production Example 9 | from 2,000 | x |

Note 1)
Evaluation of ink receptability
o: good, Δ: slightly poor, x: poor
Note 2)
ES-1: 1st desensitizing solution
ES-2: 2nd desensitizing solution As can be seen from Table 1, Examples 1 to 3 using the desensitizing solution of the present invention containing a basic aluminum chloride or a derivative thereof provided very excellent prints; Comparative Examples 1 to 4 using the desensitizing solution containing a basic aluminum chloride but having the content thereof or pH outside the ranges of the present invention and Comparative Examples 5 to 7 using the conventional desensitizing solution containing phytic acid, ferrocyanic compound or ferricyanic compound without a basic aluminum chloride did not provide satisfactory prints.

What is claimed:

1. An improved method for offset printing wherein a photosensitive layer of a master is subjected to a series of treatments including charging, exposure, development and fixation to form a lipophilic image, desensitizing the non-image portion of the photosensitive layer with a desensitizing solution, depositing an ink on the lipophilic image, and transferring the image onto paper, wherein the improvement comprises desensitizing the non-image portion of the photosensitive layer using an acid aqueous desensitizing solution comprising a basic aluminum chloride in water, a content of said basic aluminum chloride being 5 to 50% by weight of the solution, a pH of said solution being in a range of 2 to 5.

2. An improved method according to claim 1, wherein said basic aluminum chloride is contained in an amount of 10 to 30% by weight of the solution.

3. An improved method according to claim 1, wherein said desensitizing solution further comprises an additive selected from the group consisting of a pH adjustor, a pH buffer, a wetting agent, a penetrating agent, an antiseptic agent and a rust preventive.

4. An improved method according to claim 1, wherein said desensitizing solution further comprises a plurality of basic aluminum chlorides.

5. An improved method according to claim 1, wherein said desensitizing solution further comprises phytic acid.

6. An improved method according to claim 1, wherein said basic aluminum chloride is an inorganic polymer represented by the formula $[Al_2(OH)_nCl_{6-n}]_m$ where $0<n<6$ and $m>1$.

7. An improved method according to claim 1, wherein said basic aluminum chloride is a polymer comprising units of $[Al(OH)(H_2O)_5]^{2+}$ and/or $[Al(OH)(H_2O)_6]^{3+}$.

* * * * *